United States Patent
Shimai

(10) Patent No.: US 7,943,886 B2
(45) Date of Patent: May 17, 2011

(54) HEAT TREATMENT APPARATUS

(75) Inventor: Futoshi Shimai, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1070 days.

(21) Appl. No.: 11/786,203

(22) Filed: Apr. 11, 2007

(65) Prior Publication Data

US 2008/0128402 A1  Jun. 5, 2008

(30) Foreign Application Priority Data

Apr. 12, 2006  (JP) ................................. 2006-109706

(51) Int. Cl.
*F27B 5/14* (2006.01)
*F27B 5/16* (2006.01)
*F27D 7/04* (2006.01)
*G02F 1/13* (2006.01)

(52) U.S. Cl. ......... 219/390; 219/400; 118/725; 118/728

(58) Field of Classification Search ......................... None
See application file for complete search history.

(56) References Cited

U.S. PATENT DOCUMENTS

| | | | | |
|---|---|---|---|---|
| 4,493,977 A | * | 1/1985 | Arai et al. | 219/411 |
| 5,710,407 A | * | 1/1998 | Moore et al. | 219/405 |
| 5,850,071 A | * | 12/1998 | Makiguchi et al. | 219/390 |
| 5,911,896 A | * | 6/1999 | Holden et al. | 219/390 |
| 6,054,688 A | * | 4/2000 | Moschini | 219/494 |
| 6,399,923 B2 | * | 6/2002 | Kano et al. | 219/411 |
| 6,924,462 B2 | * | 8/2005 | Bagley et al. | 219/390 |
| 7,022,948 B2 | * | 4/2006 | Shang et al. | 219/390 |
| 7,442,900 B2 | * | 10/2008 | Inagawa et al. | 219/390 |
| 2001/0038002 A1 | * | 11/2001 | Kano et al. | 219/411 |

FOREIGN PATENT DOCUMENTS

| | | | |
|---|---|---|---|
| JP | 10-012522 | | 1/1998 |
| JP | 3324902 | | 7/2002 |
| JP | 2003262469 A | * | 9/2003 |

* cited by examiner

*Primary Examiner* — Joseph M Pelham

(74) *Attorney, Agent, or Firm* — Carrier Blackman & Associates, P.C.; Joseph P. Carrier; William D. Blackman

(57) ABSTRACT

A heat treatment apparatus capable of ensuring a uniform temperature distribution on a substrate and reducing the generation of a sublimate includes a housing, a mounting table being arranged to move up and down within the housing, and a first heater being provided on the mounting table to heat a substrate placed on the mounting table, a second heater is provided on one side of the housing while an exhaust device is provided on the other side of the housing.

13 Claims, 3 Drawing Sheets

FIG. 3
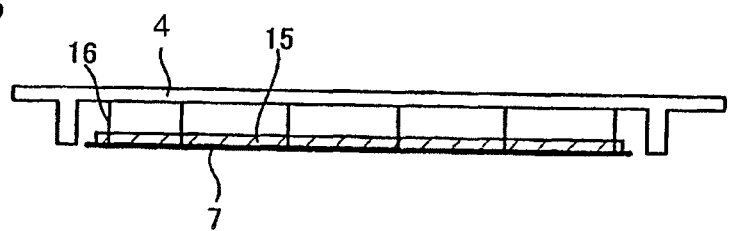
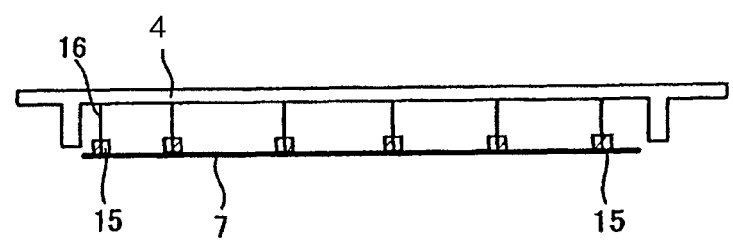
FIG. 4
FIG. 5
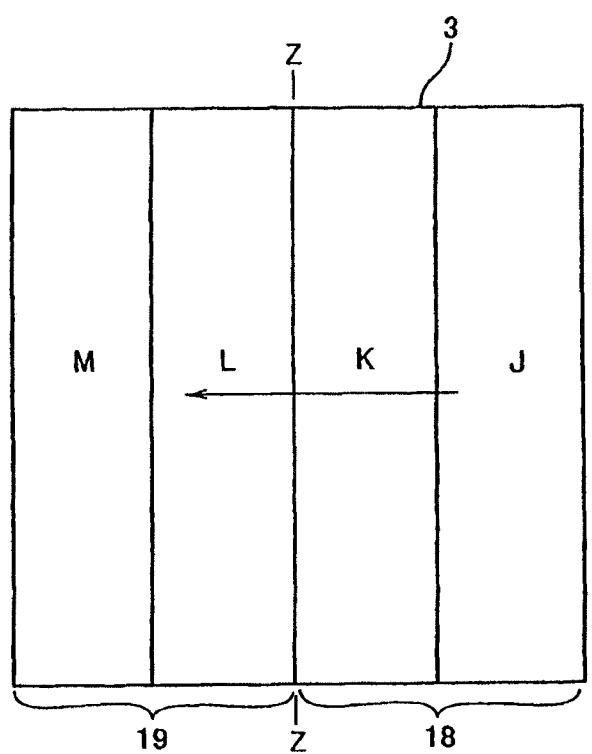

HEAT TREATMENT APPARATUS

CROSS-REFERENCE TO RELATED APPLICATIONS

The present application claims priority from Japanese patent application 2006-109706, filed Apr. 12, 2006. The entire disclosure of the referenced priority document is incorporated herein by reference.

BACKGROUND OF THE INVENTION

1. Field of the Invention

The present invention relates to a heat treatment apparatus capable of reducing generation (deposition) of a sublimate during a heat treatment process.

2. Description of the Related Art

The manufacturing process of semiconductor devices or liquid crystal panels has various kinds of processes such as a cleaning process, a coating process, an exposure process, a drying process and the like with respect to a substrate to be processed. In intermediate steps of the manufacturing process there are provided a pre-baking process and a post-baking process, and the substrate is disposed and heat-treated within a heat treatment apparatus so as to be transferred to the next process.

Herein, there is already known such a structure as shown in patent reference 1 as the heat treatment apparatus which dries a liquid applied to the surface of the substrate. In such a structure, although there have been studied devices for ensuring a uniform temperature distribution of a heating means arranged on a mounting table and for making a solvent-rich atmosphere by lessening a space over the substrate with a top plate provided above the mounting table, it is impossible to prevent the sublimate from being generated, for example.

Further, patent reference 2 discloses that an $N_2$ gas which is heated up to substantially the same temperature as a heating temperature of a heating means is supplied into and at the same time exhausted out of a heat treatment apparatus so that the gas within the heat treatment apparatus is changed in a brief period of time. With this structure, however, it is difficult to remove the sublimate generated.

Patent reference 1: Japanese Patent No. 3,324,902.
Patent reference 2: Japanese Patent Application publication No. H10-12522.

It became clear from the results of various experiments and analyses with respect to the heat treatment made by the inventor that, in the case of lessening the space over the substrate as mentioned above, not only does the solvent evaporate from an applied membrane of the solvent formed on the surface of the substrate during the treatment, but sublimate substances such as low molecular resins, dyestuffs, etc. contained in the applied liquid also evaporate. Because the sublimate substances (namely, sublimates) are deposited on a low temperature region within a processing chamber, they are prone to be deposited especially on the upper region (the surface of an upper wall) within the processing chamber (housing). When being deposited on the upper region like this, there is a possibility of being accumulated on the substrate.

As mentioned hereinabove, when ensuring the uniform temperature distribution on the substrate within the processing chamber, it is impossible to avoid the problem of the sublimate.

Further, there is another problem that partial unevenness in drying of the applied liquid, etc. is developed because the entire substrate is not able to be heated evenly when the substrate becomes large in size. Furthermore, in addition to the above, as the heating means itself for the substrate becomes large in size, it is expected that the transport of the apparatus itself will become difficult.

SUMMARY OF THE INVENTION

The present invention is made in view of the above-mentioned problems and has its object to provide a heat treatment apparatus which is capable of ensuring a uniform temperature distribution on a substrate and which enables reduction of the generation of a sublimate.

To achieve the above mentioned object, in accordance with the present invention, a heat treatment apparatus comprises a housing, a mounting table arranged to move up and down within the housing, and a first heater which heats a substrate placed on the mounting table, wherein a second heater is provided on one side of the housing while an exhaust device is provided on the other side of the housing.

The heat treatment apparatus according to the present invention has such a structure that the second heater is provided on one side of the housing while the exhaust device is provided on the other side of the housing. Therefore, when operating the exhaust device and the second heater, a hot air can flow above the mounting table within the housing. Namely, the air (hot air) heated on the one side can flow above the mounting table by exhausting the air on the other side.

With this structure, even if the sublimate is generated within the housing (on the mounting table, for example) by lessening the space above the substrate, it can be drawn by suction and exhausted towards an exhausting side by the flow of the hot air, so that the generation of the sublimate can be reduced in a low temperature region. Also, due to the hot air flow, the temperature distribution within the space is not disturbed.

In the heat treatment apparatus as mentioned above, when the first heater is provided in plural separately controlled regions, partially precise adjustment can be carried out with respect to the temperature distribution on the surface of the substrate in addition to the above-mentioned effects.

Further, in the heat treatment apparatus as mentioned above, when a third heater is provided on an upper section of the housing, in addition to the above-mentioned effects, the sublimate generated in the vicinity of the upper section of the housing can be reduced, for example, whereby it is possible to further reduce the generation of the sublimate than in the case where only the first and second heaters are provided.

Furthermore, in the heat treatment apparatus as mentioned above, when a partition plate is provided between the second heater and the mounting table, in addition to the above-mentioned effects, the flow of the hot air into the space above the mounting table can be rectified. Also, the transmission of radiant heat from the heaters, for example, can be prevented to a certain extent by the partition plate thereby reducing the influence of the radiant heat upon the substrate.

As mentioned above, according to the heat treatment apparatus of the present invention, the uniform temperature distribution can be ensured and the generation of the sublimate can be reduced so as to provide the heat treatment apparatus with high reliability and high performance.

BRIEF DESCRIPTION OF THE DRAWINGS

FIG. 3 is a first structural view in the case where a second heater is provided on a lid;

FIG. 4 is a second structural view in the case where the second heater is provided on the lid; and FIG. 5 is a plan view showing another embodiment of the first heater.

DETAILED DESCRIPTION OF THE PREFERRED EMBODIMENTS

Figure 1:
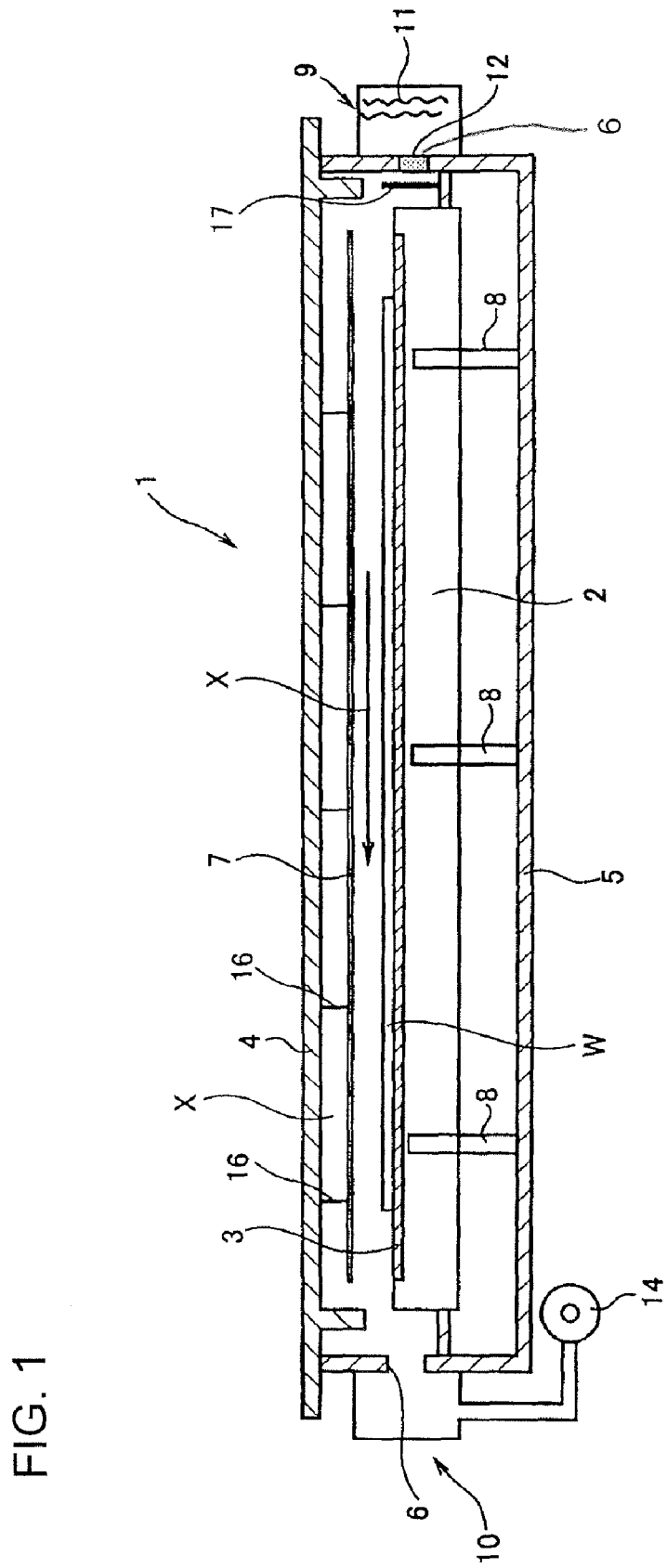
FIG. 1 is a sectional view showing an embodiment of a heat treatment apparatus according to the present invention.
Figure 2:
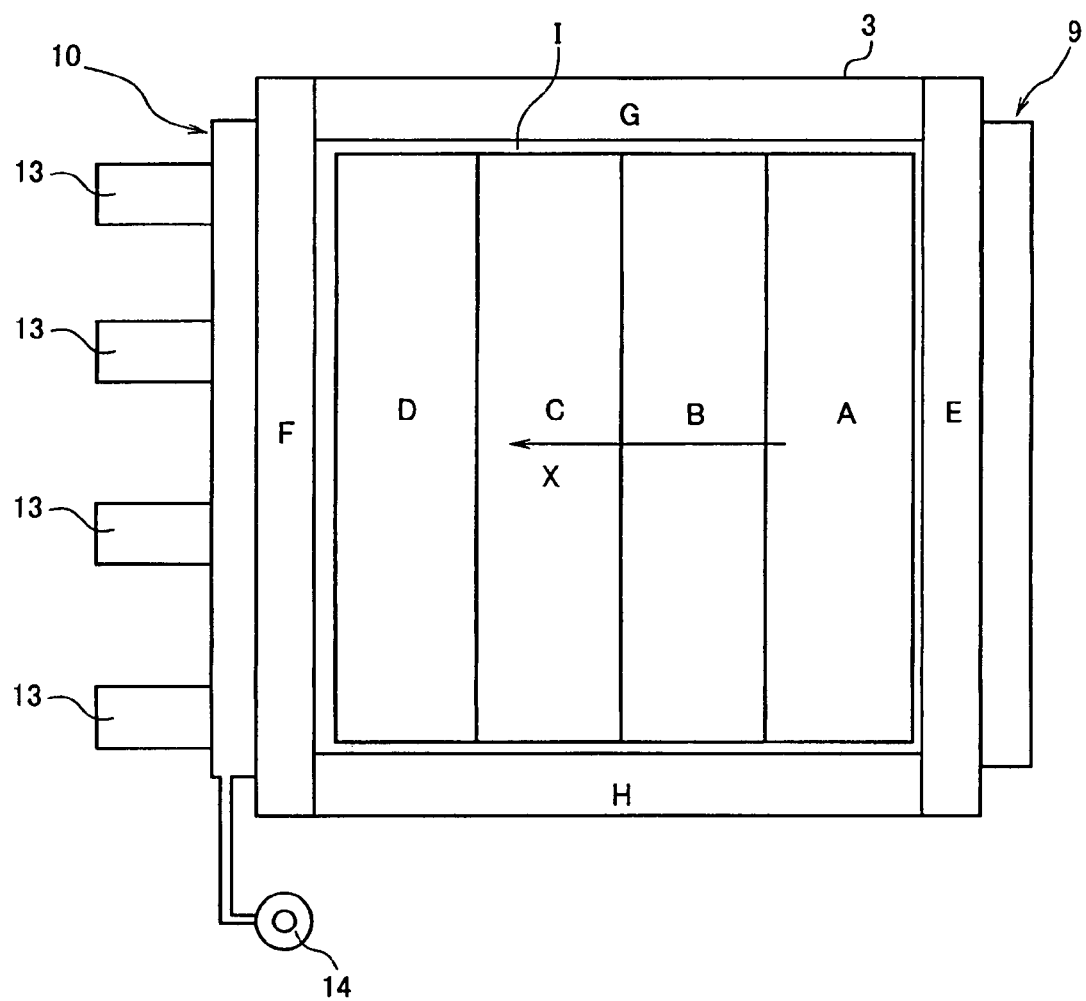
FIG. 2 is a plan view showing an embodiment of a first heater.

Embodiments of the present invention will now be explained hereunder with reference to the accompanying drawings. FIG. 1 is a schematic sectional view showing an embodiment of a heat treatment apparatus according to the present invention. FIG. 2 is a schematic plan view showing a first heater, a second heater and an exhaust device.

The heat treatment apparatus comprises a housing 1, a mounting table 2 arranged to move up and down within the housing 1, and a first heater 3 for heating a substrate W which is placed on the mounting table 2. The housing 1 is formed with an upper housing 4 and a lower housing 5. The lower housing 5 is integrally formed with the mounting table 2 on which the above-mentioned first heater 3 is provided, so as to form a hot plate. The upper housing 4 functions as a lid to cover the lower housing 5 formed as above. The first heater 3 is composed of a flat-shaped heater, etc., for example.

Openings 6 are formed on opposed lateral walls of the lower housing 5. The upper housing (lid) 4 has a top plate 7 which is suspended from it. Pins 8 (3 pieces being shown in the drawing, for example) for having the substrate W moved up and down on the mounting table 2 are arranged in predetermined positions. The distance between the substrate W and the top plate 7 is 20 mm, for example, so as to define a narrow space above the substrate W, whereby the uniform temperature distribution above the substrate W is ensured.

The substrate W is conveyed in through a substrate delivery opening (not shown) by a robot and placed on the mounting table 2. Herein, the substrate W can be conveyed in four directions onto and from the mounting table 2 as a center. Namely, the substrate W can be conveyed in from every direction and conveyed out to every direction.

Particularly, in this embodiment, a second heater 9 is provided on one side of the housing 1 and an exhaust device 10 is provided on the other side of the housing 1. As shown in FIG. 1 and FIG. 2, the second heater 9 is mounted on the opening 6 formed in one lateral wall of the lower housing 5 and has substantially the same width as the width of the first heater 3. This second heater 9 is composed, for example, of a wire heater 11, etc. Reference numeral 12 denotes a filter. On the other hand, the exhaust device 10 is mounted on the opening 6 formed in the other lateral wall of the lower housing 5 and composed of a plurality of flow adjusters 13, a blower 14, etc. In the drawing, four adjusters 13 are employed.

When the heat treatment apparatus as constructed above is actually operated (namely, when an applied liquid onto the substrate W is dried), air (i.e. hot air) heated by the wire heater 11 of the second heater 9 flows above the substrate W towards the exhaust device 10 through a space formed between the top plate 7 and the substrate W within the housing 1 by controlling the adjusters 13 and the blower 14 of the exhaust device 10 (see an arrow X in the drawing). Then, even if the sublimate is generated by lessening the distance between the substrate W and the top plate 7, it is drawn by suction and exhausted towards the exhaust device 10 by such hot air flow. By controlling each of the adjusters 13 individually and by controlling the blower 14, in compliance with the size of the substrate W, the temperature distribution of the first heater 3, etc., the hot air rectified evenly anywhere on and above the substrate W can be blown by suction and exhausted in the direction of the exhaust device 10.

In the heat treatment apparatus of the above-mentioned embodiment, as shown in FIG. 2, the first heater 3 may be divided into plural regions such as a region A, a region B, a region C and a region D, whereby the temperature distribution on the surface of the substrate W can be more partially and effectively adjusted.

Herein, it is possible to control the temperature in each of the regions A, B, C and D in such a manner that a temperature gradient (from low to high) is formed along the direction of the hot air flow (see an arrow X in the drawing). Namely, although the hot air is high in temperature just after entering into the space, the temperature gradually comes down as the air flow advances within the space. Therefore, by forming the temperature gradient along the direction of the air flow, the uniform heating of the entire substrate can be effected. The division is not limited to the form as shown in the drawing but various modifications may be made.

When being merely divided, there is a possibility of incurring the problem that unevenness in drying of the applied liquid, etc. is developed because the substrate W itself suffers the influence of the ambient temperature. Namely, in the case where the substrate W has substantially the same width as the first heater 3, particularly an outer periphery of the substrate W is prone to suffer the influence of the low temperature in an ambient area. Accordingly, in this case, it is preferable that the outer periphery of the first heater 3 is formed to be high temperature regions (a region E, a region F; a region G and a region H). With this construction, the outer periphery of the substrate W is not susceptible to the influence of the ambient temperature so as to decrease the occurrence of the above-mentioned problem.

In the case where these high temperature regions (E-H) are provided as above, an intermediate region I may be provided between the high temperature regions (E-H) and the regions (A-D). Namely, when the high temperature regions (E-H) neighbor the regions (A-D), the outer periphery of the substrate W is directly influenced by the high temperature regions (E-H). Accordingly, the provision of the intermediate region I can moderate the heat transmission and the radiation heat from the high temperature regions (E-H) so as to lessen the influence directly exerted upon the outer periphery of the substrate W.

If the size of the substrate W is less than the dimensions of the first heater 3, the outer periphery of the substrate W is positioned away from the ambient area so as not to be susceptible to the influence of the ambient temperature. Therefore, the high temperature regions (E-H) and the intermediate region I as mentioned above may not be required.

Like this, a manner of determining how to divide the first heater 3 and how to provide each of the temperature regions can be devised in response to the relationship between the size of the substrate W and the dimensions of the first heater 3. As a result, the substrate W of any size may be heated in the optimum conditions.

Further, as the first heater 3 is divided into plural regions, as shown in FIG. 5, it is possible to provide a heating section 18 (compatible with G4 generation, for example) composed of a region J and a region K and a heating section 19 (compatible with G4 generation, for example) composed of a region L and a region M, each mounted in a detachable manner along line Z as a boundary. Then, the heat treatment apparatus itself is able to be divided.

As referred to in relation to the afore-mentioned problem, in the case where the substrate W becomes large in size, it is expected that the transportation of the heat treatment apparatus itself, for example, will become difficult because the first heater 3 itself becomes large in size. However, as the heat treatment apparatus divided into plural regions as above can be assembled to form a single complete apparatus, it is possible to assemble the heat treatment apparatus on site. Further, in comparison with transportation of the large-sized heat treatment apparatus, the form of transportation can be improved. Such transportation method will be demanded when the size of the substrate W becomes still larger. Herein, in the case shown in the drawing, although two heating sections are installed to form a single heater, various modifications will be adopted in response to the number of divided heating sections.

Further, although in the above-mentioned embodiment the explanation is made with reference to a single heat treatment apparatus, in actual cases such single heat treatment apparatus is vertically layered in multiple stages.

In the heat treatment apparatus of the above-mentioned embodiment, a third heater 15 may be provided on the upper housing (lid) 4. Namely, as shown in FIG. 3, a heater 15 composed of a flat heat generator, etc. for example, is arranged on the top plate 7 to elevate the temperature of the top plate 7 during heat treatment process. With this construction, the sublimate generated in the vicinity of the lid 4 (adhered to low temperature portions of the top plate 7), for example, can be reduced, and in comparison with the aforementioned construction as shown in FIG. 1 and FIG. 2, the low temperature portions located in the upper region within the space can be heated thereby to further reduce the generation of the sublimate.

Further, as shown in FIG. 4, the heater 15 may be arranged on each of top plate suspending members (suspenders) 16 to elevate the temperature of the top plate 7. In this case, effects similar to the construction as shown in FIG. 3 can be obtained.

Further, in the afore-mentioned heat treatment apparatus, a partition plate 17 such as an aluminum plate may be provided between the second heater 9 and the mounting table 2 (at the lateral side of the mounting table 2). With this construction, the hot air does not directly flow from the second heater 9 through the opening 6 onto the substrate W, so that the hot air flowing onto the substrate W can be rectified. Also, due to the provision of the partition plate 17, the transmission of the radiation heat from the wire heater 11 as a heat source can be cut off to a certain extent. Therefore, the temperature distribution on the substrate W is not disturbed.

Still further, such partition plate 17 may be provided to surround the outer periphery of the mounting table 2 without limiting to the provision at the lateral side of the mounting table 2 as shown in FIG. 1. With this construction, it is possible to lessen the afore-mentioned influence of the ambient temperature upon the substrate W. Also, although the heat treatment apparatus of the above-mentioned embodiment has the top plate 7, which is suspended from the upper housing (lid) 4 through the suspending members 16, as explained above, there is the case where the top plate 7 is dispensed with. In such a case, similar effects can be expected with the above construction.

It is to be understood that the present invention is not limited to the above-mentioned embodiments but may be otherwise variously embodied without departing from the gist of the present invention.

What is claimed is:

1. A heat treatment apparatus comprising:
a housing;
a mounting table arranged to move up and down within said housing;
a first heater provided on said mounting table to heat a substrate placed on said mounting table;
a second heater provided on one side of said housing; and
an exhaust device is provided on the other side of said housing,
wherein said second heater and said exhaust device are arranged to create a flow of hot air in a space above the mounting table, and
said exhaust device includes a plurality of individually-adjustable flow adjusters.

2. The heat treatment apparatus according to claim 1, wherein said first heater is divided into plural separately controllable regions.

3. The heat treatment apparatus according to claim 1, further comprising a third heater provided within an upper region of said housing above the mounting table.

4. The heat treatment apparatus according to claim 1, further comprising a partition plate provided between said second heater and said mounting table.

5. The heat treatment apparatus according to claim 1, further including a top plate disposed within said housing above the mounting table, said mounting table and said top plate jointly defining said space above the mounting table.

6. The heat treatment apparatus according to claim 3, further including a top plate disposed within said housing above the mounting table and having the third heater connected thereto, said mounting table and said top plate jointly defining said space above the mounting table.

7. The heat treatment apparatus according to claim 6, wherein said first and third heaters are substantially flat.

8. The heat treatment apparatus according to claim 2, wherein said first heater includes a central region and an outer peripheral region disposed around the central region, and said outer peripheral region heats at a higher temperature than said central region.

9. The substrate heat treatment according to claim 8, wherein said first heater also includes an intermediate region disposed between said central region and said outer peripheral region, said intermediate region moderates heat transmission from said outer peripheral region to said central region.

10. The heat treatment apparatus according to claim 1, wherein said exhaust device further includes a blower.

11. The heat treatment apparatus according to claim 1, wherein said second heater and said exhaust device are mounted on respective openings defined in lower portions of opposed lateral walls of the housing and create a flow of hot air created above the mounting table in a direction toward said exhaust device.

12. The heat treatment apparatus according to claim 10, wherein said flow adjusters are individually controlled and said blower is controlled in compliance with a size of a substrate which is to be supported on the mounting table and heat treated by the apparatus.

13. The heat treatment apparatus according to claim 4, wherein said second heater and said exhaust device are mounted on respective openings defined in lower portions of opposed lateral walls of the housing and create a flow of hot air created above the mounting table in a direction toward said exhaust device, and said partition plate is disposed adjacent to the opening in the lower portion of the lateral wall of the housing on which the second heater is mounted such that the partition plate can prevent air that enters the opening from directly flowing onto a substrate on the mounting table.

* * * * *